United States Patent
Kawaguchi et al.

(10) Patent No.: US 6,794,876 B2
(45) Date of Patent: Sep. 21, 2004

(54) METHOD AND DEVICE FOR ESTIMATING OPEN CIRCUIT VOLTAGE OF BATTERY

(75) Inventors: Tomohiro Kawaguchi, Shizuoka (JP); Shuji Satake, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 38 days.

(21) Appl. No.: 10/365,519

(22) Filed: Feb. 13, 2003

(65) Prior Publication Data

US 2003/0169049 A1 Sep. 11, 2003

(30) Foreign Application Priority Data

Feb. 15, 2002 (JP) .......................................... 2002-038982
Jan. 28, 2003 (JP) .......................................... 2003-019217

(51) Int. Cl.[7] .......................................... G01N 27/416
(52) U.S. Cl. .......................................... 324/426
(58) Field of Search ................................ 324/426, 429, 324/427–434; 320/132, 136

(56) References Cited

U.S. PATENT DOCUMENTS 6,531,875 B2 * 3/2003 Satake .......................... 324/429

FOREIGN PATENT DOCUMENTS

JP   2002-234408   8/2002

* cited by examiner

*Primary Examiner*—N. Le
*Assistant Examiner*—Amy He
(74) *Attorney, Agent, or Firm*—Armstrong, Kratz, Quintos, Hanson & Brooks, LLP

(57) ABSTRACT

Measuring device measures a terminal voltage of the battery in an open circuit state in a specific cycle after completion of a charge or discharge of the battery and collecting device collects the measured terminal voltage. Computing device computes a voltage value, to which a power approximation expression asymptotically approaches, as an assumed open circuit voltage of each time period from the collected terminal voltage, wherein the power approximation expression has an exponent of −0.5 or about −0.5 and is determined on the basis of the terminal voltage of each time period of a plurality of predetermined time periods. The assumed open circuit voltage of a time period, in which its difference from the assumed open circuit voltage of a neighboring time period becomes minimum, is estimated as an open circuit voltage.

16 Claims, 7 Drawing Sheets

METHOD AND DEVICE FOR ESTIMATING OPEN CIRCUIT VOLTAGE OF BATTERY

BACKGROUND OF THE INVENTION (1) Field of the Invention

The present invention relates to a method and device for estimating an open circuit voltage of a battery, which supplies electric power to a load.

(2) Description of the Related Art

An open circuit voltage of a battery is determined by measuring a terminal voltage in its open circuit state of a battery in its equilibrium state and is a quantity reflecting a charging state of the battery. Therefore, an open circuit voltage of a battery is important in order to know how much electrical quantity remains in the battery (i.e. charging state) as to a battery in operation, which is loaded on a vehicle, for example.

In general, when a discharge current flows from a battery, a drop corresponding to the magnitude of the current takes place in a terminal voltage of the battery, on the other hand, when a charge current flows into a battery, the terminal voltage rises. For example, the voltage drop during discharge is caused by an internal impedance (combined resistance) of a battery and can be divided into a voltage drop (IR loss) due to a pure resistance (ohmic resistance) caused by structure of the battery, another voltage drop due to activation polarization of polarization resistance component caused by chemical reaction, and further voltage drop due to concentration polarization of the polarization resistance component caused by the chemical reaction.

When the discharge current becomes zero, the IR loss simultaneously becomes zero and the voltage drop due to the activation polarization also becomes zero in a relatively short period of time. The voltage drop due to the concentration polarization decreases as the discharge current decreases, however the voltage drop due to the concentration polarization remains for a relatively long period of time even when the discharge current becomes zero, because it takes a relatively long period of time for the concentration polarization to disappear by diffusion of electrolyte. Such a state in which the voltage drop due to discharge remains after completion of the discharge is called a non-equilibrium state. A terminal voltage of a battery measured in an open circuit state when the battery is in a non-equilibrium state is different from a terminal voltage measured when the battery is in an equilibrium state, that is open circuit voltage, in which the voltage drop due to the discharge completely disappears, and changes approaching to the open circuit voltage with time passing after the halt of the discharge.

In this connection, a terminal voltage of a battery, which rises as the charge current flows, is also different from an open circuit voltage, because the voltage rise due to the concentration polarization remains for a relatively long period of time similarly to the case of the discharge.

In general, a terminal voltage of a battery changes approaching to an open circuit voltage after completion of a charge as shown in FIG. 3 and changes approaching to an open circuit voltage after completion of a discharge as shown in FIG. 10. As shown in FIG. 11, after completion of a charge, for example, a time required to reach an equilibrium state is short when the temperature is high, while the time is long when the temperature is low.

Therefore, in general, a terminal voltage of a battery in an open circuit state has been measured when a certain time passes after completion of a charge or discharge, said certain time being considered to be a time required to reach an equilibrium state, which is 24 hours for example, and then thus measured terminal voltage has been regarded as an open circuit voltage.

In the method as described above, in order to obtain an open circuit voltage we have to wait for a certain period of time required for the system to reach a supposed equilibrium state after completion of a charge or discharge. Therefore, when a charge or discharge is started again before such a certain period of time required passes, there is no chance to obtain an open circuit voltage until a certain period of time passes again after the completion of such a next charge or discharge, causing a problem that there is very few chance for obtaining an open circuit voltage.

In addition, since the certain period of time required as described above varies depending upon temperature, if the terminal voltage of a battery in an open circuit state after a constant period of time passes after the completion of a charge or discharge is measured and regarded as an open circuit voltage regardless of ambient temperature, such a regarded open circuit voltage includes an error because the terminal voltage varies depending upon temperature, causing a problem that a compensation with respect to the temperature is required for canceling such an error.

SUMMARY OF THE INVENTION

It is therefore an objective of the present invention to solve the above problems and to provide a method and device for estimating an open circuit voltage of a battery, by which an open circuit voltage of a battery in operation can be relatively accurately estimated in a relatively short period of time after completion of a charge or discharge.

The present invention has been attained by finding out that a terminal voltage of a battery in an open circuit state after completion of a charge or discharge asymptotically approaches to a specific voltage, which can be estimated as an open circuit voltage according to a predetermined power approximation expression.

In order to attain the above objective, the present invention is to provide a method of estimating an open circuit voltage of a battery for supplying electric power to a load, comprising the steps of:

measuring and collecting a terminal voltage of the battery in an open circuit state in a specific cycle after completion of a charge or discharge of the battery;

computing a voltage value, to which a power approximation expression asymptotically approaches, as an assumed open circuit voltage of each time period from the collected terminal voltage, wherein the power approximation expression has an exponent of −0.5 or about −0.5 and is determined on the basis of the terminal voltage of each time period of a plurality of predetermined time periods; and estimating the assumed open circuit voltage of a time period, in which its difference from the assumed open circuit voltage of a neighboring time period becomes minimum, as an open circuit voltage.

With the construction described above, after completion of a charge or discharge of the battery, an asymptote of a power approximation expression obtained by using the terminal voltage for a time period, in which the terminal voltages in accordance with the power approximation expression are relatively gather, from the terminal voltages measured in a relatively short period of time, can be estimated as an open circuit voltage of the battery. Therefore, a method of estimating an open circuit voltage of a battery, by which an open circuit voltage of a battery can be relatively accurately estimated in a relatively short period of time after completion of a charge or discharge, can be provided.

Preferably, each time period of a plurality of predetermined time periods is defined by a combination between one of a plurality of start time points and one of a plurality of finish time points, which are predetermined with an elapsed time after completion of a charge or discharge of the battery.

With the construction described above, an accurate open circuit voltage can be obtained.

Preferably, the shortest one of the start time points and the longest one of the finish time points correspond to a start and a finish of the time period, respectively, during which the terminal voltage of the battery in an open circuit state is measured and collected.

With the construction described above, an efficient measurement for obtaining an open circuit voltage can be carried out.

Preferably, an interval between a plurality of the start time points is smaller than an interval between a plurality of the finish time points.

With the construction described above, as for the components, which have no relation with the diffusion of the electrolyte, such as an internal resistivity, activation polarization, and overvoltage accompanied by gas generation, easily become the error factor, and are included in the voltage change right after a charge or discharge, it is possible to set the time periods finely.

Preferably, a time period, in which a value obtained by dividing a summation of absolute values of a difference from the assumed open circuit voltage of a neighboring time period by the number of the neighboring time periods becomes minimum, is set to be a time period, in which a difference from the assumed open circuit voltage of a neighboring time period becomes minimum.

With the construction described above, an open circuit voltage of a battery can be estimated by the relative comparison regardless of the number of the neighboring time periods.

Preferably, when the terminal voltage in an open circuit state is collected after completion of a charge, on the basis of a difference value between the terminal voltage in an open circuit state for each time period and an assumed open circuit voltage, a predetermined power approximation expression having a negative exponent is determined, and the determination of the power approximation expression is carried out repeatedly by updating the assumed open circuit voltage until the exponent of the determined power approximation expression becomes −0.5 or about −0.5, thereby computing a voltage value to which the power approximation expression asymptotically approaches.

With the construction described above, an asymptote of a power approximation expression for each time period is obtained as the assumed open circuit voltage for each time period in a relatively short period of time after completion of the charge of the battery.

Preferably, when the terminal voltage in an open circuit state is collected after completion of a discharge, on the basis of an absolute value of a value obtained by subtracting the assumed open circuit voltage from the terminal voltage in an open circuit state for each time period and on the basis of a difference value between the terminal voltage in an open circuit state for each time period and an assumed open circuit voltage, a predetermined power approximation expression having a negative exponent is determined, and the determination of the power approximation expression is carried out repeatedly by updating the assumed open circuit voltage until the exponent of the determined power approximation expression becomes −0.5 or about −0.5, thereby computing a voltage value to which the power approximation expression asymptotically approaches.

With the construction described above, an asymptote of a power approximation expression for each time period is obtained as the assumed open circuit voltage for each time period in a relatively short period of time after completion of the discharge of the battery.

Preferably, the power approximation expression is expressed by $\alpha \cdot t^D$, where t is time, $\alpha$ is an unknown coefficient, and D is an unknown negative exponent.

With the construction described above, an assumed open circuit voltage when the exponent D of the power approximation expression $\alpha \cdot t^D$ becomes −0.5 or about −0.5 can be set as the assumed open circuit voltage for the time period.

Preferably, the number of values of the measured terminal voltage in an open circuit state for each time period is set to be an optional number equal to or more than 2 and the terminal voltage of the optional number is subjected to a regression calculation, thereby determining the exponent D of the power approximation expression.

With the construction described above, even if the exponent of the power approximation expression $\alpha \cdot t^D$ does not become −0.5, the assumed open circuit voltage of each time period can be obtained when the predetermined number of the determination of the power approximation expression is carried out.

In order to attain the above objective, the present invention is to provide a device for estimating an open circuit voltage of a battery for supplying electric power to a load, comprising:

measuring means for measuring a terminal voltage of the battery in an open circuit state in a specific cycle after completion of a charge or discharge of the battery;

collecting means for collecting the terminal voltage of the battery in an open circuit state, which is measured by the measuring means; and computing means for computing a voltage value, to which a power approximation expression asymptotically approaches, as an assumed open circuit voltage of each time period from the terminal voltage collected by the collecting means, wherein the power approximation expression has an exponent of −0.5 or about −0.5 and is determined on the basis of the terminal voltage of each time period of a plurality of predetermined time periods, wherein the assumed open circuit voltage of a time period, in which its difference from the assumed open circuit voltage of a neighboring time period becomes minimum, is estimated as an open circuit voltage.

With the construction described above, after completion of a charge or discharge of the battery, an asymptote of a power approximation expression obtained by using the terminal voltage for a time period, in which the terminal voltages in accordance with the power approximation expression are relatively gather, from the terminal voltages measured in a relatively short period of time, can be estimated as an open circuit voltage of the battery. Therefore, a device for estimating an open circuit voltage of a battery, by which an open circuit voltage of a battery can be relatively accurately estimated in a relatively short period of time after completion of a charge or discharge, can be provided.

DESCRIPTION OF THE PREFERRED EMBODIMENTS

Before a method for estimating an open circuit voltage of a battery according to the present invention is explained with reference to FIG. 2 together with a preferred embodiment of a device for estimating an open circuit voltage of a battery according to the present invention, a basic idea of the present invention will be explained in the following.

Figure 3:
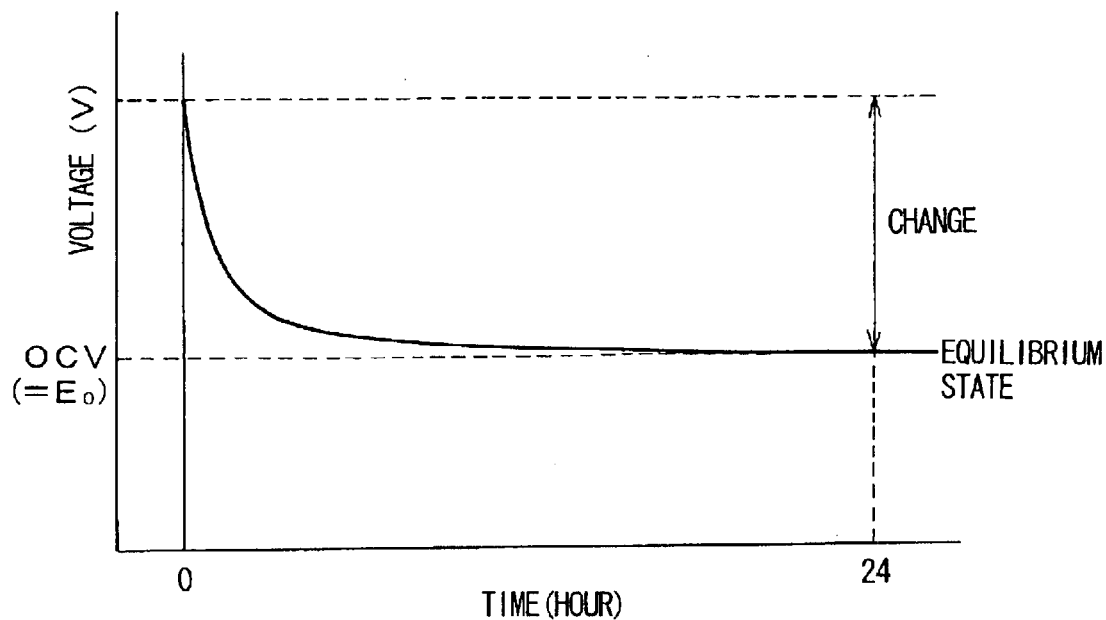
FIG. 3 is a graph illustrating a change in a terminal voltage of a battery in an open circuit state after completion of a charge.

In general, when a charge of a battery mounted on a vehicle is completed, as for a terminal voltage of a battery in an open circuit state, a component of the terminal voltage, which has risen caused by concentration polarization, gradually decreases as time passes and asymptotically approaches to an open circuit voltage (OCV=$E_0$), which corresponds to a terminal voltage of a battery in an open circuit state after 24 hours, for example, as shown in FIG. 3. Such an asymptotic curve is generally expressed by a power expression.

Figure 5:
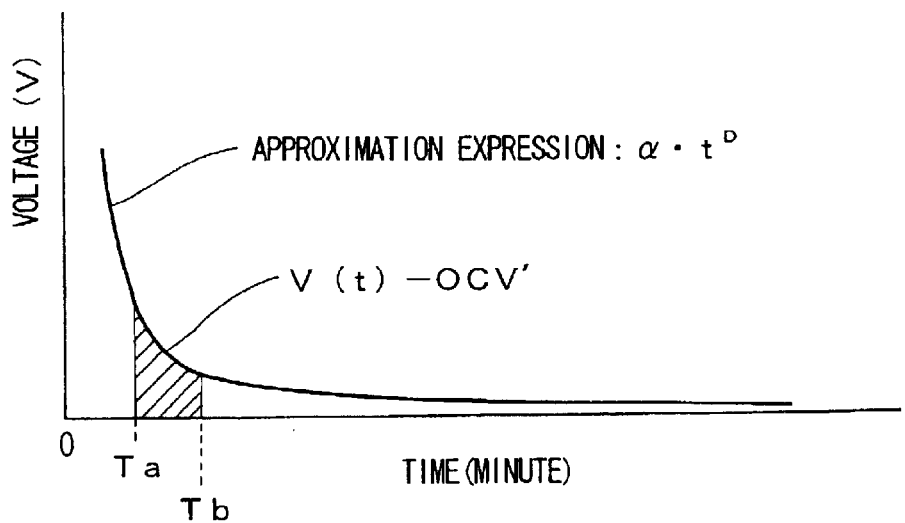
FIG. 5 is another graph for explaining a method of estimating an open circuit voltage according to the present invention.
Figure 4:
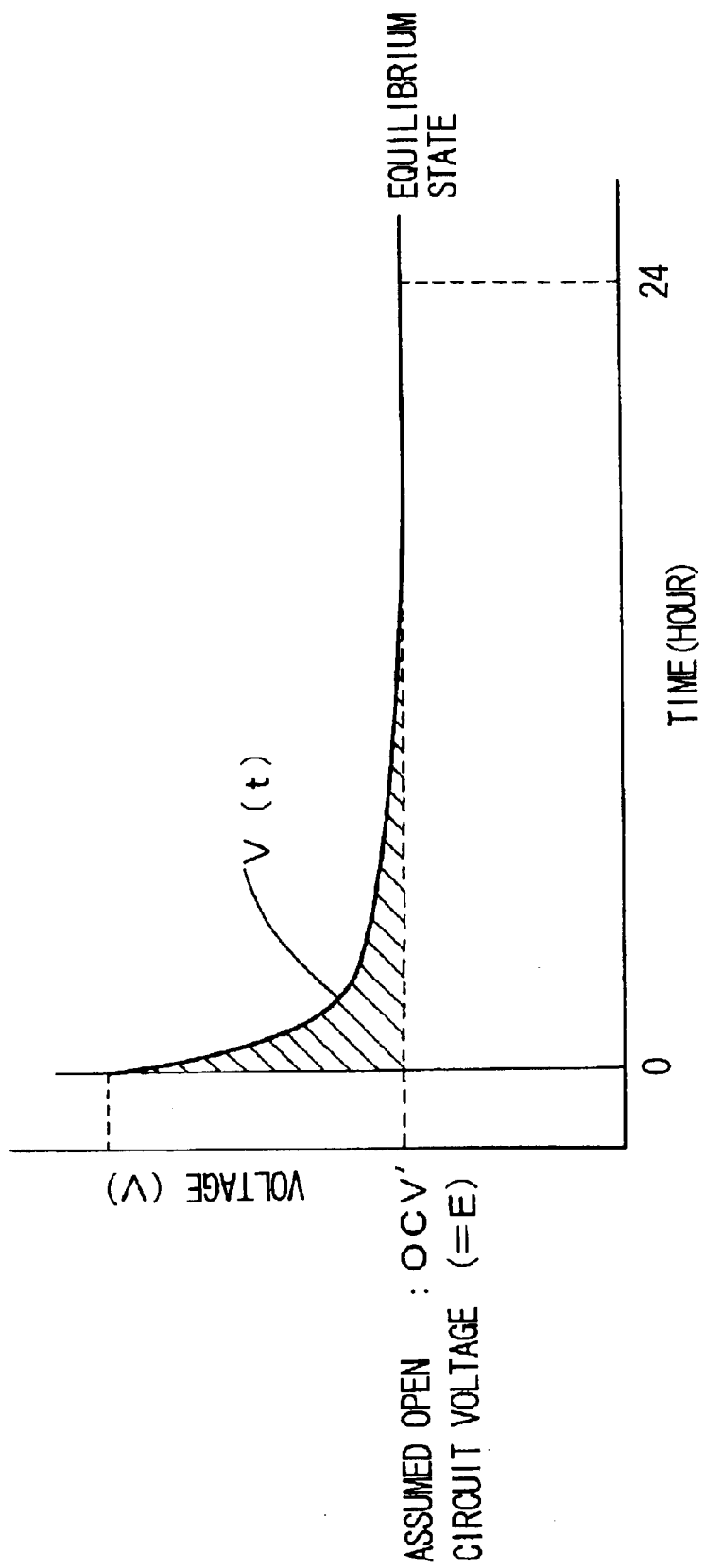
FIG. 4 is a graph for explaining a method of estimating an open circuit voltage according to the present invention.

When an open circuit voltage $E_0$ is unknown, as shown in FIG. 4, if an assumed open circuit voltage (OCV'=E) is defined and subtracted from a terminal voltage V(t), V(t)−OCV' is expressed by a power approximation expression $\alpha \cdot t^D$, which approaches the transverse axis, as shown in FIG. 5.

In general, when a diffusion phenomenon is approximately expressed by a power approximation expression $\alpha \cdot t^D$, normally an exponent D is about −0.5. Therefore, if a change in a terminal voltage of a battery after completion of a charge depends on a voltage change arisen due to only diffusion of electrolyte, an assumed open circuit voltage E can be regarded as an open circuit voltage when a power approximation expression $\alpha \cdot t^D$, in which the exponent D becomes −0.5, is obtained.

Figure 6:
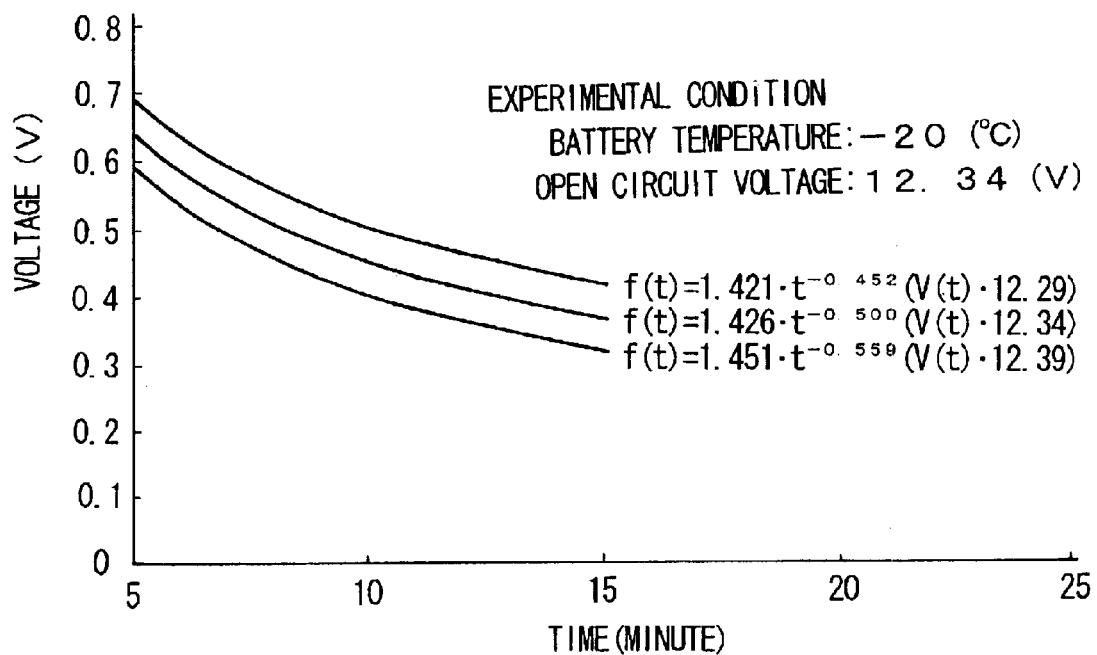
FIG. 6 is a graph for materially exemplifying the validity of a method according to the present invention.

An example for proving that an exponent D becomes about −0.5 when a diffusion phenomenon is approximately expressed by a power approximation expression $\alpha \cdot t^D$ will be explained with reference to FIG. 6 in the following.

As for a battery having an open circuit voltage 12.34 V, an assumed open circuit voltage is set to be 12.34 V. In a power approximation expression, which is determined by using a value calculated by subtracting this assumed open circuit voltage from a terminal voltage measured between 5 and 15 minutes after a charge is halted, the exponent D becomes −0.500, while when the assumed open circuit voltage is set to be 12.29 V which is smaller than 12.34 V, the exponent D becomes −0.452 which is larger than −0.500, and further, while when the assumed open circuit voltage is set to be 12.39 V which is larger than 12.34 V, the exponent D becomes −0.559 which is smaller than −0.500. Consequently, it is understood that when the exponent D of the power approximation expression becomes −0.5, the assumed open circuit voltage becomes equal to an open circuit voltage.

However, in general, a change in a terminal voltage of a battery right after completion of a charge or discharge includes components, which have no relation with the diffusion of the electrolyte, such as an internal resistivity, activation polarization, and overvoltage accompanied by gas generation, causing an error for determining an open circuit voltage. Therefore, it is meaningless to measure and collect a terminal voltage of a battery in an open circuit state for a time period while it includes such components, which have no relation with the diffusion of the electrolyte.

Further, in general, since the accuracy for estimation might deteriorate depending upon the resolution of the measurement when a change in the voltage is decreased as time passes, therefore regarding a terminal voltage of a battery in an open circuit state for a time period while the accuracy for estimation deteriorates because of low resolution of the measurement, further measurement of the terminal voltage becomes meaningless.

Then, in order to remove the measurement for a time period while a change in the terminal voltage includes the components that have no relation with the diffusion of the electrolyte causing the error, the time point for starting to measure the terminal voltage of a battery in an open circuit state can be set a time point when a specific time period Ta passes after the completion of a charge or discharge. However, a time point at which the error factors are canceled off varies depending upon a condition of the battery, therefore in the event that the time point for starting to measure the terminal voltage is determined uniformly, depending upon a condition of the battery, a terminal voltage having no error factor is measured but is not used, and alternatively, a terminal voltage having error factors is measured and is used.

In order to remove the measurement for a time period while the estimation accuracy deteriorates caused by a limited resolution of the measurement, the time point for finishing to measure the terminal voltage can be set to be a time point when a specific time period Tb passes after the completion of a charge or discharge. However, whether or not the resolution does matter depends on a magnitude of the error factor between values of the terminal voltage, which are used for carrying out the power approximation. Therefore in the event that the time point for finishing to measure the terminal voltage is determined uniformly, depending upon a condition of the battery, a terminal voltage measured with good resolution is measured but is not used, and alternatively, a terminal voltage measured with bad resolution is measured and is used.

Of course, a time period while no error factor is included in a change in the terminal voltage may be considered to be set regardless of the condition of a battery. However, if the time period of the measurement is set in advance from the viewpoint described above, there might be a problem that there is no time period for measuring or that the predetermined time period is not necessarily adequate.

In a method and device for estimating an open circuit voltage of a battery according to the present invention, an open circuit voltage of a battery can be accurately estimated not depending upon condition of the battery as is explained in the following.

First, the specific time period Ta as defined above is set short, for example, 5 minutes, during which the terminal voltage in an open circuit state can be measured when the error factor is quickly canceled, while the specific time period Tb as defined above is set long, for example, 80 minutes, during which the terminal voltage in an open circuit state can be measured even when the resolution of the measurement is deteriorated to a certain extent, then the terminal voltage in an open circuit state is measured in a cycle of, for example, 10 second for a time period from Ta to Tb after the completion of a charge or discharge and then, the measured terminal voltage is collected by storing it in a memory.

Thus, the sampling of the terminal voltage is started after the specific time period Ta, for example 5 minutes, passes after a charge or discharge is halted, because the voltage change right after a charge or discharge includes components, which have no relation with the diffusion of the electrolyte, such as an internal resistivity, activation polarization, and overvoltage accompanied by gas generation, therefore if such components are taken in, they cause an error for determining an open circuit voltage, that is, they are the error factors for determining an open circuit voltage. That is, such error factors are eliminated from data for obtaining the power approximation expression in the present invention.

Further, the sampling of the terminal voltage is finished when the specific time period Tb, for example 80 minutes, passes after the charge or discharge is halted, not only because it is convenient to do so but also because the voltage change decreases as time passes, thereby possibly deteriorating the estimation accuracy of an open circuit voltage depending upon the resolution of the measurement, and further because the influence of voltage drop due to dark current of a vehicle increases as time passes.

As for defining a plurality of time periods with regard to the terminal voltage in an open circuit state, which is measured and collected for the time period from Ta to Tb after the completion of a charge or discharge, with respect to Ta (5 minutes), defined are, for example, the shortest Ta1 (5 minutes), Ta2 (15 minutes), Ta3 (25 minutes), Ta4 (35 minutes) and Ta5 (45 minutes), while with respect to Tb (80 minutes), defined are, for example, the longest Tb4 (80 minutes), Tb3 (60 minutes), Tb2 (40 minutes) and Tb1 (20 minutes). Then, Ta1–Ta5 and Tb4–Tb1 are used as the respective starting and finishing time points in combination, thus a plurality of time periods with regard to the collected terminal voltage in an open circuit state are predetermined.

That is, with regard to the terminal voltage in an open circuit state, which is measured and collected for the time period from Ta to Tb after the completion of a charge or discharge, sixteen different time periods can be thoroughly set up, which are from Ta1 to Tb4, Tb3, Tb2 or Tb1, from Ta2 to Tb4, Tb3, Tb2 or Tb1, from Ta3 to Tb4, Tb3 or Tb2, from Ta4 to Tb4, Tb3 or Tb2, and from Ta5 to Tb4 or Tb3.

Since the shortest time point of the start and longest time point of the finish as defined above correspond to the time points of start and finish of the time period for measuring and collecting the terminal voltage in an open circuit state, respectively, time points of start and finish of the time period for measuring and collecting the terminal voltage are not necessary to be set separately. Moreover, since the time interval (i.e. 10 minutes) between the time points of start is set smaller than the time interval (i.e. 20 minutes) between the time points of finish, therefore it is possible to set the time period finely with regard to the components of the voltage change especially arisen right after a charge or discharge, wherein the components are, for example, an internal resistivity, activation polarization, and overvoltage accompanied by gas generation, which have no relation with the diffusion of the electrolyte and the components easily become the error factor for determining an open circuit voltage.

After the predetermined time period Ta, for example 5 minutes, passes after completion of a charge or discharge of a battery, the terminal voltage of the battery in an open circuit state is measured and collected in a cycle of, for example, 10 seconds until the predetermined time period Tb, for example 80 minutes, passes. Then, with regard to the collected terminal voltage, a voltage value, to which a power approximation expression asymptotically approaches, is computed as an assumed open circuit voltage of each time period, wherein the power approximation expression has an exponent of −0.5 or about −0.5 and is determined on the basis of the terminal voltage of each time period of a plurality of predetermined time periods.

Especially when a charge of the battery is finished, as shown in FIG. 5, the assumed open circuit voltage E is subtracted from the terminal voltage collected for each time period, thereby computing the power approximation expression $\alpha \cdot t^D$ for each time period.

On the other hand, when a discharge of the battery is finished, as for the terminal voltage of the battery in an open circuit state, a component thereof that has fallen due to the concentration polarization is gradually canceled, thereby the terminal voltage gradually increases and asymptotically approaches an open circuit voltage $E_0$, which is a terminal voltage of the battery in an equilibrium state, for example, after 24 hours. Thus, in case of a discharge, since the assumed open circuit voltage E is always larger than the power approximation expression $\alpha \cdot t^D$, a value obtained by subtracting the assumed open circuit voltage E from the terminal voltage in an open circuit state measured for each time period is negative, therefore an absolute value of the value obtained by subtracting the assumed open circuit voltage E from the terminal voltage in an open circuit state is used, thereby computing the power approximation expression $\alpha \cdot t^D$ for each time period.

In general, after a charge or discharge is completed, on the basis of a value obtained by subtracting the assumed open circuit voltage from the terminal voltage in an open circuit state for each time period, a predetermined power approximation expression having a negative exponent is determined, and the determination of the power approximation expression is carried out repeatedly by updating the assumed open circuit voltage until the exponent of the determined power approximation expression becomes −0.5, then the assumed open circuit voltage when the exponent becomes −0.5 is estimated as an open circuit voltage.

If there is a case that the exponent does not become −0.5 even when the determination of the power approximation expression is carried out repeatedly by updating the assumed open circuit voltage for a predetermined times, it is judged that the exponent does become −0.5 by carrying out the determination by updating for a predetermined times and the assumed open circuit voltage at that time is estimated as an open circuit voltage, thereby eliminating further unnecessary process for determining the power approximation expression.

After a battery was charged from 0% to 100%, on the basis of the terminal voltage in an open circuit state measured in a constant cycle of 10 seconds for a time period from Ta1 to Tb4 after the completion of the charge, the terminal voltage in an open circuit state measured for each time period was subjected to a power approximation, thereby computing the assumed open circuit voltage. The results are shown in Table 1.

TABLE 1

| Ta (min) | Tb1 20 | Tb2 40 | Tb3 60 | Tb4 80 |
|---|---|---|---|---|
| Ta1 5 | 12.7953 | 12.7704 | 12.7752 | 12.7841 |
| left | | left −0.0249 | left 0.0048 | left 0.0089 |
| right | 0.0249 | right −0.0048 | right −0.0089 | right |
| upper | | upper | upper | upper |
| lower | 0.0414 | lower 0.0103 | lower −0.0013 | lower −0.0059 |
| Ta2 15 | 12.7538 | 12.7600 | 12.7765 | 12.7900 |
| left | | left 0.0062 | left 0.0165 | left 0.0134 |
| right | −0.0062 | right −0.0165 | right −0.0135 | right |
| upper | −0.0414 | upper −0.0103 | upper 0.0013 | upper 0.0059 |
| lower | | lower −0.0094 | lower −0.0120 | lower −0.0115 |
| Ta3 25 | | 12.7695 | 12.7885 | 12.8015 |
| left | | left | left 0.0190 | left 0.0130 |
| right | | right −0.0190 | right −0.0130 | right |
| upper | | upper 0.0094 | upper 0.0120 | upper 0.0115 |
| lower | | lower −0.0188 | lower −0.0113 | lower −0.0097 |
| Ta4 35 | | 12.7883 | 12.7997 | 12.8112 |
| left | | left | left 0.0114 | left 0.0114 |
| right | | right −0.0114 | right −0.0114 | right |
| upper | | upper 0.0188 | upper 0.0113 | upper 0.0097 |
| lower | | lower | lower −0.0097 | lower −0.0074 |
| Ta5 45 | | | 12.8095 | 12.8186 |
| left | | | left | left 0.0091 |
| right | | | right −0.0091 | right |
| upper | | | upper 0.0097 | upper 0.0074 |
| lower | | | lower | lower |

In Table 1, there is shown a difference from the assumed open circuit voltage of a neighboring time period as well. For example, it is shown that the assumed open circuit voltage is 12.7765 V for the time period Ta2–Tb3 and that its difference in comparison with the assumed open circuit voltage 12.7600 V for the time period Ta2–Tb2 (denoted by "left" in Table 1), its difference in comparison with the assumed open circuit voltage 12.7900 V for the time period Ta2–Tb4 (denoted by "right"), its difference in comparison with the assumed open circuit voltage 12.7752 V for the time period Ta1–Tb3 (denoted by "upper") and its difference in comparison with the assumed open circuit voltage 12.7885 V for the time period Ta3–Tb3 (denoted by "lower") are 0.0165, −0.0135, 0.0013 and −0.0120, respectively. In Table 1, a blank means that there is no corresponding neighboring time period.

As shown in Table 1, when comparing the differences between the assumed open circuit voltage of each time period and that of its neighboring time period, the time period Ta1–Tb3 (i.e. 5 minutes–60 minutes) had the minimum difference. Further, the assumed open circuit voltage based on the terminal voltage in an open circuit state, which was measured for the time period Ta1–Tb3, had a very small difference that was about 1 mV, from a terminal voltage measured when 24 hours passed after completion of a charge and the battery became in an equilibrium state, i.e. an observed value of the open circuit voltage (in an equilibrium state of the battery) 12.77425 V. It was confirmed that there was no assumed open circuit voltage having less difference than those as described above for the other time periods.

Table 2 shows a similar result for a battery, which was charged from 0% to 50%. In this case, the time period Ta4–Tb3 (i.e. 35 minutes–60 minutes) had the minimum difference. That is, the assumed open circuit voltage 12.3040 V thereof had a difference, i.e. about 7 mV in comparison with an observed value of the open circuit voltage (in an equilibrium state of the battery) 12.2969 V. This value of about 7 mV was less than about 27 mV for the time period Ta1–Tb3 (5 minutes–60 minutes).

TABLE 2

| Ta (min) | Tb1 20 | Tb2 40 | Tb3 60 |
|---|---|---|---|
| Ta1 5 | 12.3493 | 12.3335 | 12.3241 |
| left | | left −0.0158 | left −0.0094 |
| right | 0.0158 | right 0.0094 | right |
| upper | | upper | upper |
| lower | 0.0180 | lower 0.0094 | lower 0.0098 |
| Ta2 15 | 12.3313 | 12.3221 | 12.3143 |
| left | | left −0.0092 | left −0.0078 |
| right | 0.0092 | right 0.0078 | right |
| upper | −0.0180 | upper −0.0114 | upper −0.0098 |
| lower | | lower 0.0079 | lower 0.0060 |
| Ta3 25 | | 12.3142 | 12.3083 |
| left | | left | left −0.0059 |
| right | | right 0.0059 | right |
| upper | | upper −0.0079 | upper −0.0059 |
| lower | | lower 0.0068 | lower 0.0043 |
| Ta4 35 | | 12.3074 | 12.3040 |
| left | | left | left −0.0034 |
| right | | right 0.0034 | right |
| upper | | upper −0.0068 | upper −0.0043 |
| lower | | lower | lower |

Accordingly, an assumed open circuit voltage for a time period, in which its difference from an assumed open circuit voltage for a neighboring time period becomes minimum among the assumed open circuit voltages determined for a plurality of predetermined time periods, that is, a time period, in which a value obtained by dividing a summation of absolute values of a difference from the assumed open circuit voltage of a neighboring time period by the number of the neighboring time periods becomes minimum, is set to be an open circuit voltage of the battery, thereby an open circuit voltage can be accurately estimated.

Figure 2:
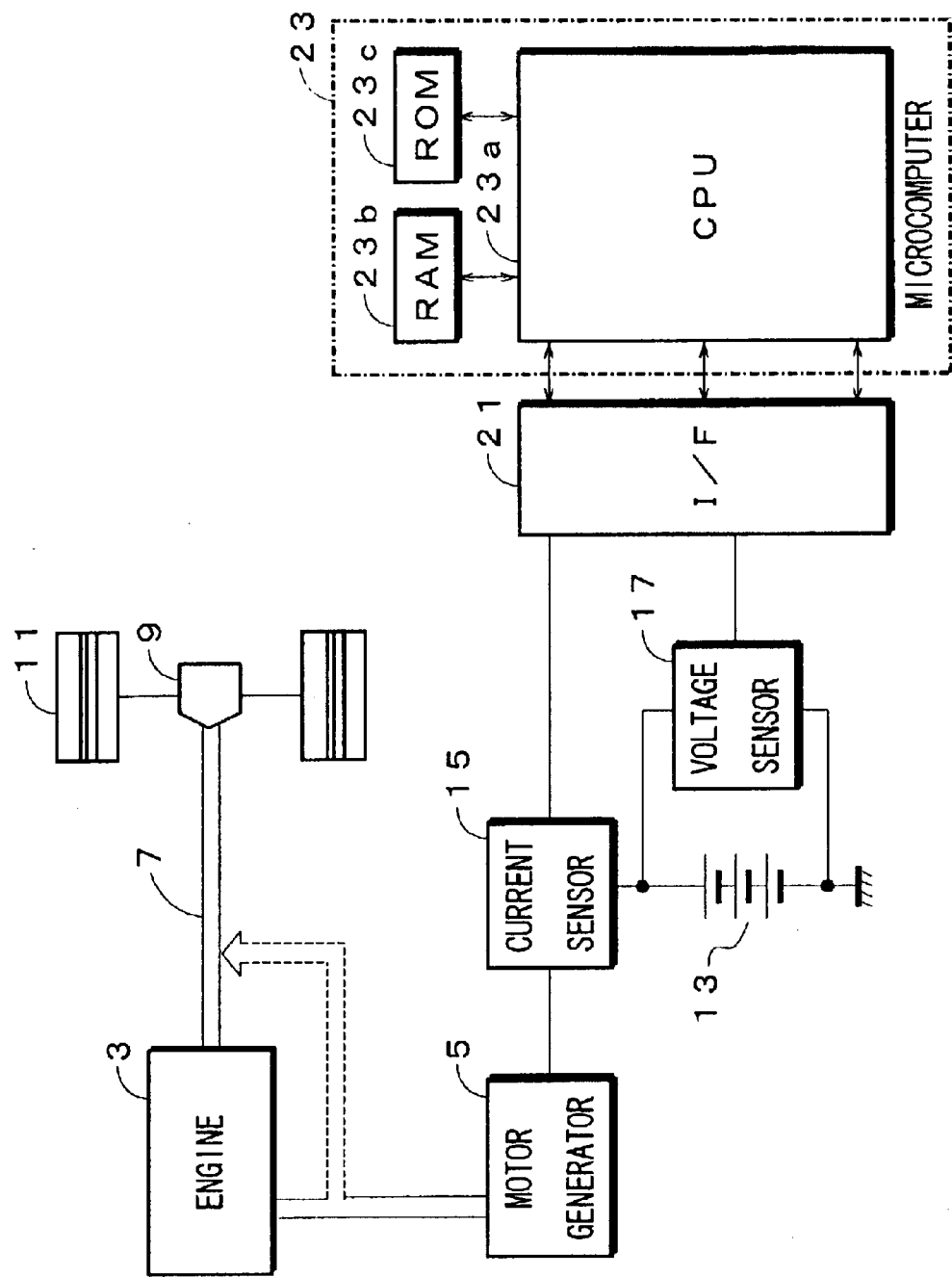
FIG. 2 illustrates a primary construction of a device for estimating an open circuit voltage of a battery for use in a vehicle according to a preferred embodiment, to which a method of estimating an open circuit voltage of a battery according to the present invention is applied, showing by a block diagram partially.

FIG. 2 illustrates a primary construction of a device for estimating an open circuit voltage of a battery for use in a vehicle according to a preferred embodiment, to which a method of estimating an open circuit voltage of a battery according to the present invention is applied, showing by a block diagram partially. A device for estimating an open circuit voltage of a battery for use in a vehicle according to the preferred embodiment is mounted on a hybrid vehicle having an engine 3 and motor generator 5.

As for the hybrid vehicle, in its normal operation, only the output power from the engine 3 is transmitted to a wheel 11 by way of a drive shaft 7 and differential case 9, thereby the vehicle travels, while in its high load operation, the motor generator 5 functions as a motor with an electric power from a battery 13, transmitting the output power from the motor generator 5 in addition to the output power from the engine 3 to the wheel 11 by way of the drive shaft 7, thereby the vehicle attains an assist traveling.

Further, as for the hybrid vehicle, the motor generator 5 functions as a generator upon deceleration or braking so that the kinetic energy is transformed into the electric energy, thereby charging the battery 13.

Further, the motor generator 5 is used as a starter motor for forcibly rotating a flywheel of the engine 3 upon starting of the engine 3 accompanied with switching on of a starter switch (not shown). In such a case, the motor generator 5 receives a large current in a short period of time. When the engine 3 starts by the motor generator 5 accompanied with switching on of the starter switch, accompanying with the removal of the operation of an ignition key (not shown), the starter switch becomes off and the ignition switch or an accessory switch becomes on, thereby the discharge current from the battery 13 becomes a stationary current.

A device 1 for estimating an open circuit voltage of a battery for use in a vehicle according to the preferred embodiment includes a current sensor 15, which detects the discharge current I of the battery 13 with regard to electric equipment such as a motor for assist traveling and a motor generator 5 and the charge/discharge current from the motor generator 5 and a voltage sensor 17, which detects a terminal voltage V of the battery 13, having a resistance of about 1 M ohm, which is connected in parallel with the battery 13.

The device 1 also includes a microcomputer 23, into which the output from the current sensor 15 and voltage sensor 17 are taken after A/D conversion in an interface circuit (hereinafter, I/F) 21.

The microcomputer 23 includes a CPU 23a, RAM 23b and ROM 23c, in which the CPU 23a is connected to the I/F 21 as well as to the RAM 23b and ROM 23c, and further to the starter switch, ignition switch, accessory switch, and switches of the electric equipment except the motor generator 5.

The RAM 23b has a data area for storing various data and a work area for use in various processings. A control program to make the CPU 23a carry out various processings is installed in the ROM 23c.

The current value and voltage value, which are the output from the current sensor 15 and voltage sensor 17, respectively, are taken into the CPU 23a of the microcomputer 23 by way of the I/F 21.

In the following, a process for estimating an open circuit voltage of a battery, which is carried out by the CPU 23a according to the program installed in the ROM 23c, will be explained with reference to FIGS. 7 and 8.

The microcomputer 23, which starts operating by receiving the electric power form the battery 13, judges whether or not a charge or discharge is completed by detecting whether or not a current value is zero on the basis of the current value obtained by sampling an output from the current sensor 15. When the completion of a charge or discharge is detected as a result of the above judgment, a process for estimating an open circuit voltage shown in a flow chart in FIG. 7 is started. In the process, first whether or not the predetermined time period Ta1, for example 5 minutes, has passed after the completion of a charge or discharge is judged (step S1).

If judged not yet passed, it is necessary to wait. If judged passed (Y at step S1), a terminal voltage of the battery in its open circuit state is measured in a cycle of a constant time period, for example 10 seconds, by using an output from the voltage sensor 16 and collecting the measured terminal voltage by storing it in the data area (corresponding to the collecting means) of the RAM 23b (step S2). Then, this sampling of the terminal voltage is continued until the predetermined time period Tb4, for example 80 minutes, have passed after the completion of a charge or discharge (N at step S3).

When the time period Tb4 has passed (Y at step S3), the time period Ta is set by selecting one of a plurality of the predetermined start time points such as 5, 15, 25 and 35 minutes in a measuring time period defined from 5 to 80 minutes after the completion of a charge or discharge (step S4), and also the time period Tb is set by selecting one of a plurality of the predetermined finish time points such as 20, 40, 60 and 80 minutes, then one of a plurality of time periods is determined by combining the set start and finish time points (steps S4 and S5). When the time period is determined, a process for computing the assumed open circuit voltage for the pertinent time period is carried out by using the terminal voltage measured for the time period (step S6). This process for computing the assumed open circuit voltage is continuously carried out until the computation is completed for all the time periods (N at step S7).

When the assumed open circuit voltage is computed for all the time periods, as for the assumed open circuit voltage for each time period, its difference from an assumed open circuit voltage for a neighboring time period is computed and the computed difference is stored in the data area of the RAM 23b (step S8). Then a time period, in which the difference from the assumed open circuit voltage for the neighboring time period is minimum, is selected and then, the assumed open circuit voltage for the selected time period is estimated as an open circuit voltage of the battery (step S9). The selection of the time period, in which the difference from the assumed open circuit voltage for the neighboring time period is minimum, is actually carried out by selecting a time period, in which a value obtained by dividing a summation of absolute values of the difference from the assumed open circuit voltage of the neighboring time period by the number of the neighboring time periods becomes minimum.

Figure 1:
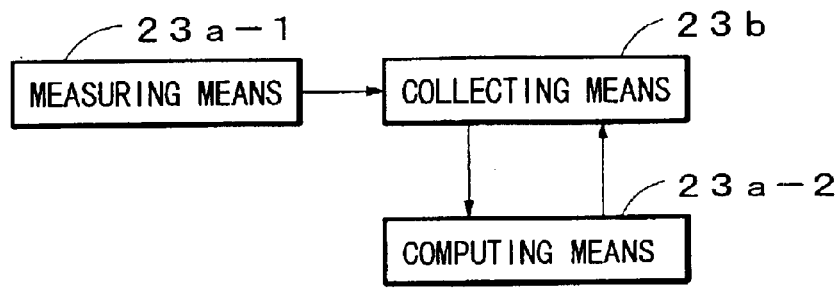
FIG. 1 is a block diagram of a basic constitution of a device for estimating an open circuit voltage of a battery according to the present invention.
Figure 8:
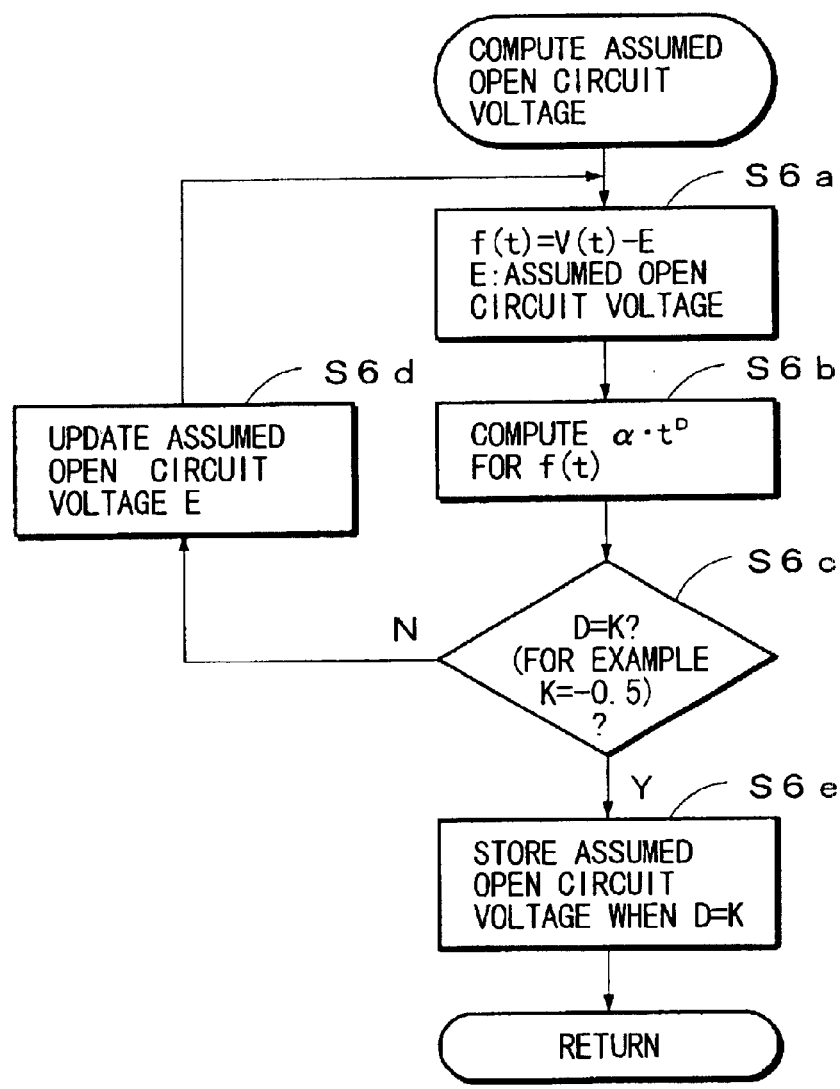
FIG. 8 is a flow chart illustrating a material process for computing an assumed open circuit voltage shown in FIG. 7.
Figure 7:
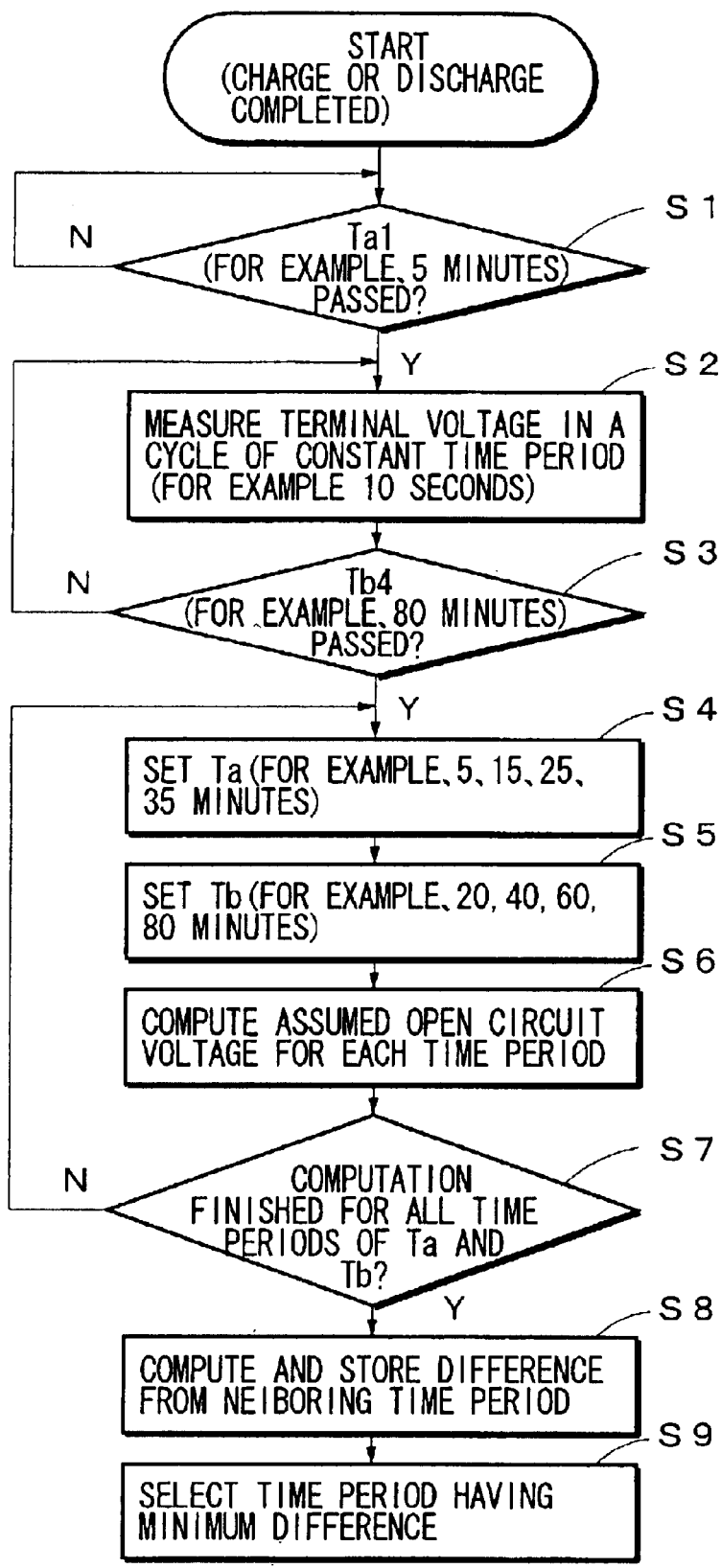
FIG. 7 is a flow chart illustrating a process that a microcomputer shown in FIG. 2 carries out according to a program predetermined for estimating an open circuit voltage of a battery.
Figure 10:
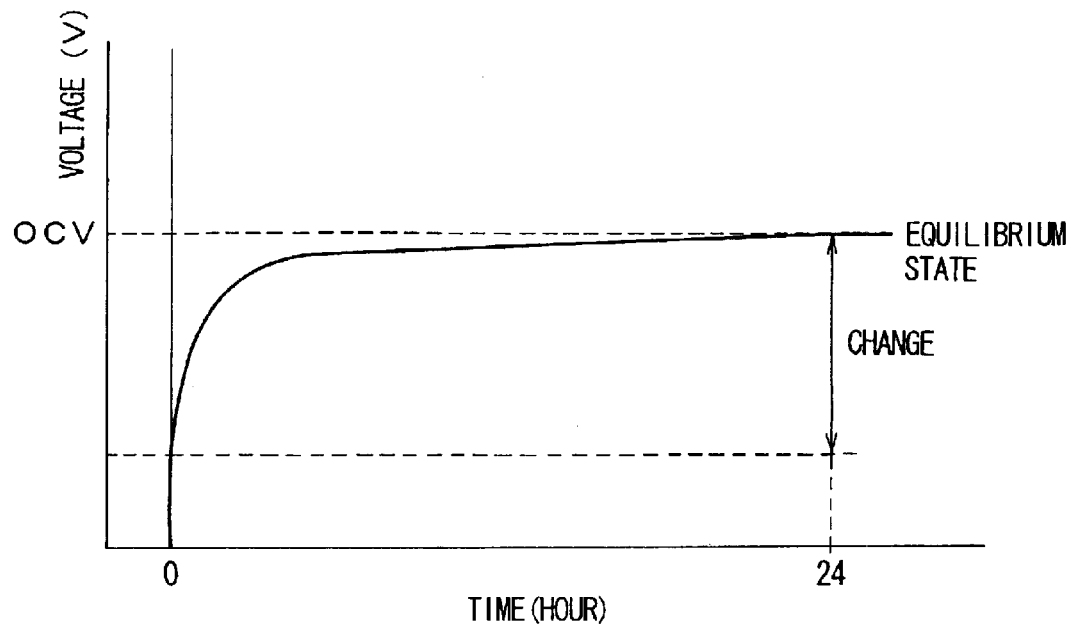
FIG. 10 is a graph illustrating a change in a terminal voltage of a battery in an open circuit state after completion of a discharge.
Figure 11:
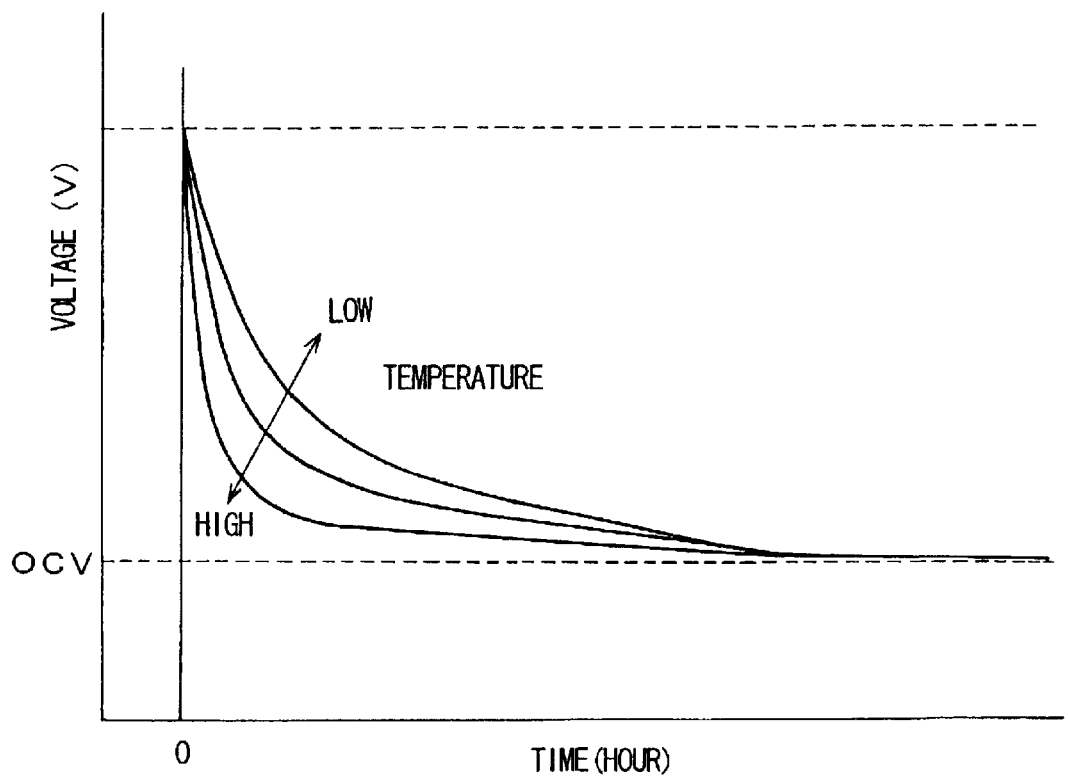
FIG. 11 is a graph illustrating a change in a terminal voltage of a battery in an open circuit state after completion of a charge, which varies depending upon temperature.

The process for computing the assumed open circuit voltage for each time period at step S6 in the flow chart in FIG. 7 is actually carried out according to a flow chart shown in FIG. 8.

First, a difference between the terminal voltage V(t) measured for each time period and the assumed open circuit voltage E, that is, in case of after completion of a charge, a value of the measured terminal voltage V(t) minus the assumed open circuit voltage E, while in case of after completion of a discharge, an absolute value of a value of the measured terminal voltage V(t) minus the assumed open circuit voltage E, is computed (step S6a), then a power approximation is subjected to thus computed value f(t), thereby determining a predetermined power approximation expression having a negative exponent (step S6b).

When the power approximation expression is determined, whether or not the exponent of the determined power approximation expression is equal to −0.5 is judged (step S6c), then as a result of the judgment if the exponent D does not reach −0.5 (N at step S6c), the assumed open circuit voltage E is updated (step S6d), then returning to step S6a, a process for subtracting the assumed open circuit voltage E from the measured terminal voltage V(t) is carried out as to the updated assumed open circuit voltage. If the exponent D reaches −0.5 (Y at step S6c), the assumed open circuit voltage E when the exponent D reaches −0.5 is stored in the data area of the RAM 23b as the assumed open circuit voltage for the pertinent time period (step S6e), thereby finishing a series of the process and returning to the flow chart in FIG. 7.

If the exponent of the determined power approximation expression does not readily reach −0.5, a voltage value when the predetermined number of times for determining the power approximation expression is carried out is computed as the assumed open circuit voltage for the pertinent time period and a series of the process can be finished.

In the flow chart in FIG. 8, the measurement is carried out in a constant cycle of 10 seconds for the time period from Ta1 to Tb4. The microcomputer may be set in non-operation state for a time period except the time period of measurement carried out in a cycle of 10 seconds.

In the following, a method how to determine the power approximation expression at step S6b will be explained.

The power approximation expression $y = \alpha \cdot x^D$ can also be expressed by:

$$\ln(y) = \ln(\alpha) + D \cdot \ln(x).$$

If setting as $\ln(y) = Y$, $\ln(\alpha) = A$, and $\ln(x) = X$, it is expressed by:

$$Y = A + D \cdot X,$$

which is a linear equation.

Being computed by regression analysis, A and D become as follows.

If a difference between the approximation expression and the real data is set to be $\epsilon$, it is expressed by:

$$Yi = A + D \cdot Xi + \epsilon i \ (i=1, 2, \ldots, n).$$

Since A and D, by which $\epsilon i$ becomes minimum as a whole, are to be computed, therefore, A and D, by which the summation of $\epsilon i^2$ becomes minimum, are computed.

The above is a description of least squares method. According to least squares method, it is described as follows.

$$\delta \Sigma \epsilon i / \delta A = 0$$

$$\delta \Sigma \epsilon i / \delta D = 0$$

When these simultaneous questions are solved, $$\Sigma Yi - D \Sigma Xi - \Sigma A = 0$$

$$\Sigma XiYi - D \Sigma Xi^2 - A \Sigma Xi = 0$$

Thereby, $$D = (\Sigma XiYi - nXaYa)/(\Sigma Xi^2 - nXa^2)$$

$$A = Ya - DXa$$

Here, Xi is data of X axis, Yi is data of Y axis, n is the number of data, Xa is an average of Xi, and Ya is an average of Yi.

Since $A = \ln(\alpha)$ as described above, $$\alpha = e^A$$

Therefore, the power approximation expression $y = \alpha \cdot x^D$ can be computed.

Figure 9:
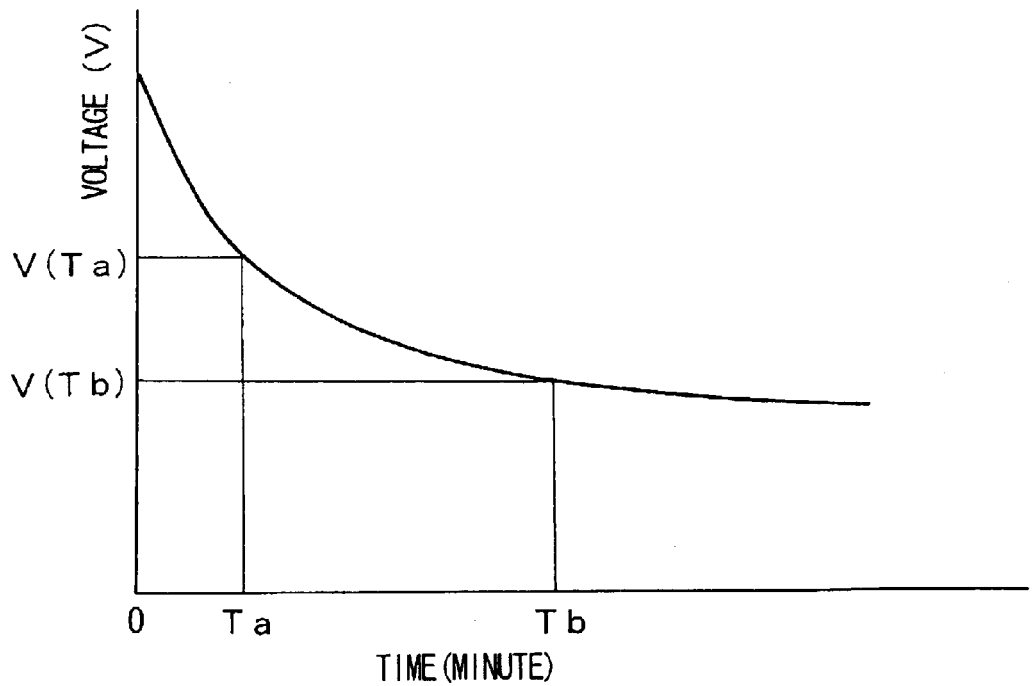
FIG. 9 is a graph for explaining a method for updating an assumed open circuit voltage.

In the following, a method how to update the assumed open circuit voltage at step S6d will be explained with reference to FIG. 9 and Table 3.

TABLE 3

| the number of times of search | lower limit | | intermediate | | upper limit | |
|---|---|---|---|---|---|---|
| | assumed open circuit voltage | D | assumed open circuit voltage | D | assumed open circuit voltage | D |
| 1 | 0.000 | −0.019 | 6.350 | −0.037 | 12.700 | −2.639 |
| 2 | 6.350 | −0.037 | 9.525 | −0.073 | 12.700 | −2.639 |
| 3 | 9.525 | −0.073 | 11.113 | −0.140 | 12.700 | −2.639 |
| 4 | 11.113 | −0.140 | 11.906 | −0.163 | 12.700 | −2.639 |
| 5 | 11.906 | −0.163 | 12.303 | −0.464 | 12.700 | −2.639 |
| 6 | 12.303 | −0.464 | 12.502 | −0.763 | 12.700 | −2.639 |
| 7 | 12.303 | −0.464 | 12.402 | −0.575 | 12.502 | −0.763 |
| 8 | 12.303 | −0.464 | 12.353 | −0.514 | 12.402 | −0.575 |
| 9 | 12.303 | −0.464 | 12.328 | −0.488 | 12.353 | −0.514 |
| 10 | 12.328 | −0.488 | 12.340 | −0.500 | 12.353 | −0.514 |

When the assumed open circuit voltage for each time period is computed, the following method is used to update the assumed open circuit voltage. First, the power approximation is carried out with regard to, for example, an upper limit V(Tb) of the assumed open circuit voltage, a lower limit 0 of the assumed open circuit voltage, and an intermediate value V(Tb)/2 of the assumed open circuit voltage as shown in FIG. 9.

Then, values of the exponent D(V(Tb)), D(0) and D(V(Tb)/2) obtained from the respective approximations are compared with each other, that is, a comparison whether D for the intermediate value of the assumed open circuit voltage is equal to −0.5 or not is carried out and if not equal to −0.5, a comparison whether the D is larger or smaller than −0.5 is carried out. If the D for the intermediate value of the assumed open circuit voltage is not equal to −0.5, with regard to a range that includes data corresponding to −0.5, that is, in an example of Table 3, a range between the intermediate value of the assumed open circuit voltage and the upper limit of the assumed open circuit voltage, a value of D for a divided assumed open circuit voltage (V(Tb)+V(Tb)/2)/2 is computed and the comparison by computation is repeated until the D becomes −0.5. An actual example is shown in Table 3. In Table 3, except for the number of search being 1, values of the exponent D for the lower limit, intermediate and upper limit are computed, however regarding a further search after the first search, the computation for the exponent D is necessary only for the intermediate value.

In such a case that the exponent does not become −0.5 even when the updating of the assumed open circuit voltage is carried out repeatedly, it is judged that the exponent does become −0.5 at a time point when a difference between the lower and upper limits of the assumed open circuit voltage reaches about 0.001 V and the assumed open circuit voltage at this time point is estimated as an open circuit voltage, thereby eliminating further unnecessary process for determining the power approximation expression.

The reason why the initial upper limit of the assumed open circuit voltage is set V(Tb) is that an open circuit voltage never becomes higher than V(Tb). A value of an open circuit voltage after completion of a discharge (i.e. electric capacity 0%) may be used as the lower limit of the assumed open circuit voltage, however when an overdischarge takes place, since the pertinent value is possibly lower than the open circuit voltage after completion of a discharge (i.e. electric capacity 0%), therefore the initial value is set to be 0 V.

In the device 1 for estimating an open circuit voltage of a battery for use in a vehicle according to the preferred embodiment, the step S2 in the flow chart in FIG. 7 is a process, which corresponds to the measuring means described in the claim, and the steps S4–S6 is a process, which corresponds to the computing means described in the claim.

In the following, an action for estimating an open circuit voltage according to the preferred embodiment will be explained.

When electric equipment (load) except for motor generator 5 in a hybrid vehicle is in operation or the motor generator 5 is in operation so as to function as a motor, a battery 13 carries out a discharge, while the motor generator 5 is in operation so as to function as a generator, a battery 13 carries out a charge. A charge or discharge of the battery 13 can be detected by taking in an output from the current sensor 15 and the completion of a charge or discharge can also be detected by knowing that the output from the current sensor 15 is zero.

When the completion of a charge or discharge is detected by the output from the current sensor 15, an output from the voltage sensor 17 is taken in, thereby a terminal voltage of the battery in an open circuit state is periodically measured, then these measured voltage values together with a period of time elapsed after the completion of a charge or discharge are stored and collected in the data area of the RAM 23b.

A plurality of predetermined time periods are set with regard to the collected terminal voltage of the battery in an open circuit state, then the assumed open circuit voltage E is subtracted from the terminal voltage V(t) for each time period, thereby determining the power approximation expression by applying least squares method to the values obtained by the subtraction. It is judged whether or not an exponent D of the determined power approximation expression $\alpha \cdot t^D$ becomes −0.5. If not, the assumed open circuit voltage E is updated and a similar process is carried out to determine the power approximation expression $\alpha \cdot t^D$ for each time period. Such an action is repeatedly carried out until the exponent becomes −0.5 or about −0.5, then a voltage value at that time point is obtained as the assumed open circuit voltage for the pertinent time period. The confirmation of the exponent becoming about −0.5 can be carried out by knowing that the number of determinations of the power approximation expression becomes a predetermined number or by knowing that the region of the assumed open circuit voltage becomes less than a predetermined region.

The assumed open circuit voltage for each time period thus obtained is an asymptote of the power approximation expression $\alpha \cdot t^D$. Therefore, even if the asymptote of the power approximation expression $\alpha \cdot t^D$ changes depending on temperature or even if the time period Ta or Tb becomes different, the assumed open circuit voltage does not shift. Therefore, there is no need of temperature compensation at all and the assumed open circuit voltage can be useful as it is even if a characteristic of the battery is different a little. Moreover, if a charge or discharge current does not flow for the time period from Ta1 to Tb4 after completion of a charge or discharge, an open circuit voltage can be estimated every time, that is, an open circuit voltage can frequently be estimated.

In the explanation as described above, the asymptote of the power approximation expression is considered not to change depending on temperature. This is because although strictly speaking an open circuit voltage does change slightly as temperature changes, the change in the open circuit voltage is negligibly small.

The present invention can effectively be applied to a vehicle such as a hybrid vehicle, in which a motor generator charges regenerated electric power into a battery, in order to know the charging state of the battery appropriately and to improve the fuel efficiency by using the battery effectively.

In this specification, a terminal voltage of a battery, which is influenced by polarization and so on, is defined as the terminal voltage of a battery in an-open circuit state, while a terminal voltage in an open circuit state of a battery in an equilibrium state is defined as an open circuit voltage.

In the preferred embodiment as described above, the estimation of an open circuit voltage of a battery in a hybrid vehicle is explained. However, the present invention can also be applied to an estimation of an open circuit voltage of a battery, which is mounted on various vehicles such as a general 14V vehicle, vehicle having multi-power sources such as 14V and 42V, electric vehicle, usual gasoline motor vehicle.

In the preferred embodiment as described above, in an example shown in Table 1, the measurement is carried out for 80 minutes after completion of a charge or discharge. However, if the resolution of the analogue-to-digital conversion is about 5 mV or so upon reading in the measured terminal voltage of a battery in an open circuit state, the measurement up to 60 minutes is sufficient and the measurement up to 80 minutes is not necessary.

In the preferred embodiment as described above, the time interval of 10 minutes for Ta and the time interval of 20 minutes for Tb are set. However, instead, these time intervals may be set shorter than those, respectively. In principle, the accuracy should be improved to some extent when a short time interval is used. However, since the voltage difference between the neighboring time periods is sufficiently small, the time intervals such as 10 minutes for Ta and 20 minutes for Tb as described above, for example, are very much satisfactory.

The aforementioned preferred embodiments are described to aid in understanding the present invention and variations may be made by one skilled in the art without departing from the spirit and scope of the present invention.

What is claimed is:

1. A method of estimating an open circuit voltage of a battery for supplying electric power to a load, comprising the steps of:

measuring and collecting a terminal voltage of the battery in an open circuit state in a specific cycle after completion of a charge or discharge of the battery;

computing a voltage value, to which a power approximation expression asymptotically approaches, as an assumed open circuit voltage of each time period from the collected terminal voltage, wherein the power approximation expression has an exponent of −0.5 or about −0.5 and is determined on the basis of the terminal voltage of each time period of a plurality of predetermined time periods; and estimating the assumed open circuit voltage of a time period, in which its difference from the assumed open circuit voltage of a neighboring time period becomes minimum, as an open circuit voltage.

2. The method of estimating an open circuit voltage of a battery according to claim 1, wherein each time period of a plurality of predetermined time periods is defined by a combination between one of a plurality of start time points and one of a plurality of finish time points, which are predetermined with an elapsed time after completion of a charge or discharge of the battery.

3. The method of estimating an open circuit voltage of a battery according to claim 2, wherein the shortest one of the start time points and the longest one of the finish time points correspond to a start and a finish of the time period, respectively, during which the terminal voltage of the battery in an open circuit state is measured and collected.

4. The method of estimating an open circuit voltage of a battery according to claim 3, wherein an interval between a plurality of the start time points is smaller than an interval between a plurality of the finish time points.

5. The method of estimating an open circuit voltage of a battery according to claim 3, wherein a time period, in which a value obtained by dividing a summation of absolute values of a difference from the assumed open circuit voltage of a neighboring time period by the number of the neighboring time periods becomes minimum, is set to be a time period, in which a difference from the assumed open circuit voltage of a neighboring time period becomes minimum.

6. The method of estimating an open circuit voltage of a battery according to claim 1, wherein the power approximation expression is expressed by $\alpha \cdot t^D$, where t is time, $\alpha$ is an unknown coefficient, and D is an unknown negative exponent.

7. The method of estimating an open circuit voltage of a battery according to claim 6, wherein the number of values of the measured terminal voltage in an open circuit state for each time period is set to be an optional number equal to or more than 2 and the terminal voltage of the optional number is subjected to a regression calculation, thereby determining the exponent D of the power approximation expression.

8. A method of estimating an open circuit voltage of a battery for supplying electric power to a load, comprising the steps of:
    measuring and collecting a terminal voltage of the battery in an open circuit state in a specific cycle after completion of a charge of the battery;
    computing a voltage value, to which a power approximation expression asymptotically approaches, as an assumed open circuit voltage of each time period from the collected terminal voltage, wherein the power approximation expression has an exponent of −0.5 or about −0.5 and is determined on the basis of the terminal voltage of each time period of a plurality of predetermined time periods; and
    estimating the assumed open circuit voltage of a time period, in which its difference from the assumed open circuit voltage of a neighboring time period becomes minimum, as an open circuit voltage, wherein on the basis of a difference value between the terminal voltage in an open circuit state for each time period and an assumed open circuit voltage, a predetermined power approximation expression having a negative exponent is determined, and the determination of the power approximation expression is carried out repeatedly by updating the assumed open circuit voltage until the exponent of the determined power approximation expression becomes −0.5 or about −0.5, thereby computing a voltage value to which the power approximation expression asymptotically approaches.

9. The method of estimating an open circuit voltage of a battery according to claim 8, wherein a time period, in which a value obtained by dividing a summation of absolute values of a difference from the assumed open circuit voltage of a neighboring time period by the number of the neighboring time periods becomes minimum, is set to be a time period, in which a difference from the assumed open circuit voltage of a neighboring time period becomes minimum.

10. The method of estimating an open circuit voltage of a battery according to claim 8, wherein the power approximation expression is expressed by $\alpha \cdot t^D$, where t is time, $\alpha$ is an unknown coefficient, and D is an unknown negative exponent.

11. The method of estimating an open circuit voltage of a battery according to claim 10, wherein the number of values of the measured terminal voltage in an open circuit state for each time period is set to be an optional number equal to or more than 2 and the terminal voltage of the optional number is subjected to a regression calculation, thereby determining the exponent D of the power approximation expression.

12. A method of estimating an open circuit voltage of a battery for supplying electric power to a load, comprising the steps of:
    measuring and collecting a terminal voltage of the battery in an open circuit state in a specific cycle after completion of a discharge of the battery;
    computing a voltage value, to which a power approximation expression asymptotically approaches, as an assumed open circuit voltage of each time period from the collected terminal voltage, wherein the power approximation expression has an exponent of −0.5 or about −0.5 and is determined on the basis of the terminal voltage of each time period of a plurality of predetermined time periods; and
    estimating the assumed open circuit voltage of a time period, in which its difference from the assumed open circuit voltage of a neighboring time period becomes minimum, as an open circuit voltage, wherein on the basis of an absolute value of a value obtained by subtracting the assumed open circuit voltage from the terminal voltage in an open circuit state for each time period and on the basis of a difference value between the terminal voltage in an open circuit state for each time period and an assumed open circuit voltage, a predetermined power approximation expression having a negative exponent is determined, and the determination of the power approximation expression is carried out repeatedly by updating the assumed open circuit voltage until the exponent of the determined power approximation expression becomes −0.5 or about −0.5, thereby computing a voltage value to which the power approximation expression asymptotically approaches.

13. The method of estimating an open circuit voltage of a battery according to claim 12, wherein a time period, in which a value obtained by dividing a summation of absolute values of a difference from the assumed open circuit voltage of a neighboring time period by the number of the neighboring time periods becomes minimum, is set to be a time period, in which a difference from the assumed open circuit voltage of a neighboring time period becomes minimum.

14. The method of estimating an open circuit voltage of a battery according to claim 12, wherein the power approximation expression is expressed by $\alpha \cdot t^D$, where t is time, $\alpha$ is an unknown coefficient, and D is an unknown negative exponent.

15. The method of estimating an open circuit voltage of a battery according to claim 14, wherein the number of values of the measured terminal voltage in an open circuit state for each time period is set to be an optional number equal to or more than 2 and the terminal voltage of the optional number is subjected to a regression calculation, thereby determining the exponent D of the power approximation expression.

16. A device for estimating an open circuit voltage of a battery for supplying electric power to a load, comprising:

measuring means for measuring a terminal voltage of the battery in an open circuit state in a specific cycle after completion of a charge or discharge of the battery;

collecting means for collecting the terminal voltage of the battery in an open circuit state, which is measured by the measuring means; and computing means for computing a voltage value, to which a power approximation expression asymptotically approaches, as an assumed open circuit voltage of each time period from the terminal voltage collected by the collecting means, wherein the power approximation expression has an exponent of −0.5 or about −0.5 and is determined on the basis of the terminal voltage of each time period of a plurality of predetermined time periods, wherein the assumed open circuit voltage of a time period, in which its difference from the assumed open circuit voltage of a neighboring time period becomes minimum, is estimated as an open circuit voltage.

* * * * *